United States Patent
Kim et al.

(10) Patent No.: US 11,721,768 B2
(45) Date of Patent: Aug. 8, 2023

(54) TRANSISTOR AND DISPLAY DEVICE INCLUDING THE SAME

(71) Applicants: Samsung Display Co., LTD., Yongin-si (KR); Industry-Academic Cooperation Foundation, Yonsei University, Seoul (KR)

(72) Inventors: Taesang Kim, Seoul (KR); Min Seong Kim, Seoul (KR); Hyun Jae Kim, Seoul (KR); Jun Hyung Lim, Seoul (KR)

(73) Assignees: SAMSUNG DISPLAY CO., LTD., Gyeonggi-do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 72 days.

(21) Appl. No.: 17/349,214

(22) Filed: Jun. 16, 2021

(65) Prior Publication Data

US 2022/0029021 A1    Jan. 27, 2022

(30) Foreign Application Priority Data

Jul. 22, 2020 (KR) .................. 10-2020-0091258

(51) Int. Cl.
| | |
|---|---|
| *H01L 27/00* | (2006.01) |
| *H01L 29/00* | (2006.01) |
| *H01L 29/786* | (2006.01) |
| *H01L 27/12* | (2006.01) |
| *H01L 29/10* | (2006.01) |
| *H01L 29/24* | (2006.01) |

(52) U.S. Cl.
CPC ...... *H01L 29/7869* (2013.01); *H01L 27/1251* (2013.01); *H01L 29/105* (2013.01); *H01L 29/24* (2013.01)

(58) Field of Classification Search
CPC ............ H01L 27/1251; H01L 27/3262; H01L 27/1288; H01L 27/1225; H01L 27/1156; H01L 27/1229; H01L 29/66969; H01L 29/24; H01L 29/78696; H01L 29/105; H01L 29/7869; H01L 29/78693
See application file for complete search history.

(56) References Cited

U.S. PATENT DOCUMENTS 9,153,699 B2 * 10/2015 Yamazaki ........... H01L 29/7869
9,601,524 B2 * 3/2017 Tae ..................... H01L 27/1248
(Continued)

FOREIGN PATENT DOCUMENTS

| KR | 10-0939998 B1 | 2/2010 |
|---|---|---|
| KR | 1020180124942 A | 11/2018 |
| KR | 1020190051633 A | 5/2019 |

OTHER PUBLICATIONS

European Search Report for European Patent Application No. 21180508.0 dated Dec. 8, 2021.

*Primary Examiner* — Nikolay K Yushin
(74) *Attorney, Agent, or Firm* — Cantor Colburn LLP

(57) ABSTRACT

A transistor includes a gate electrode, an active layer facing the gate electrode, and a source electrode and a drain electrode connected to the active layer. The active layer includes a lower active layer including an oxide-based semiconductor material, and an upper active layer including the oxide-based semiconductor material and an oxygen-gettering material.

23 Claims, 13 Drawing Sheets

(56) References Cited

U.S. PATENT DOCUMENTS

| | | | |
|---|---|---|---|
| 9,780,228 B2 * | 10/2017 | Kim | H01L 29/66969 |
| 2013/0334533 A1 * | 12/2013 | Yamazaki | H01L 29/786 |
| | | | 257/66 |
| 2015/0263176 A1 | 9/2015 | Cheng | |
| 2016/0126262 A1 * | 5/2016 | Tae | H01L 27/1259 |
| | | | 438/155 |
| 2016/0163867 A1 * | 6/2016 | Kim | H01L 29/7869 |
| | | | 257/43 |
| 2017/0256569 A1 * | 9/2017 | Ohara | H01L 29/4908 |
| 2020/0212135 A1 | 7/2020 | Zhang | |

* cited by examiner

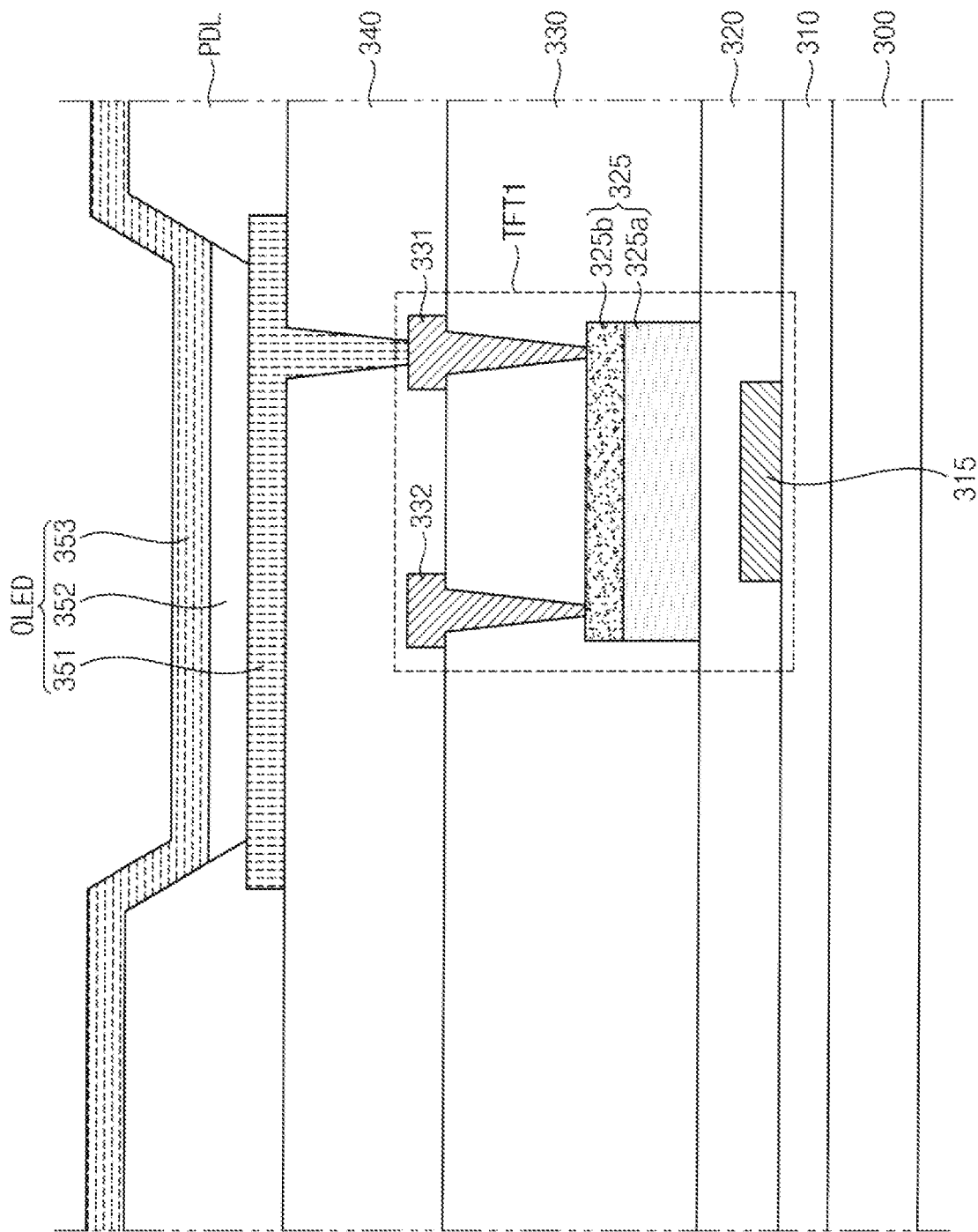

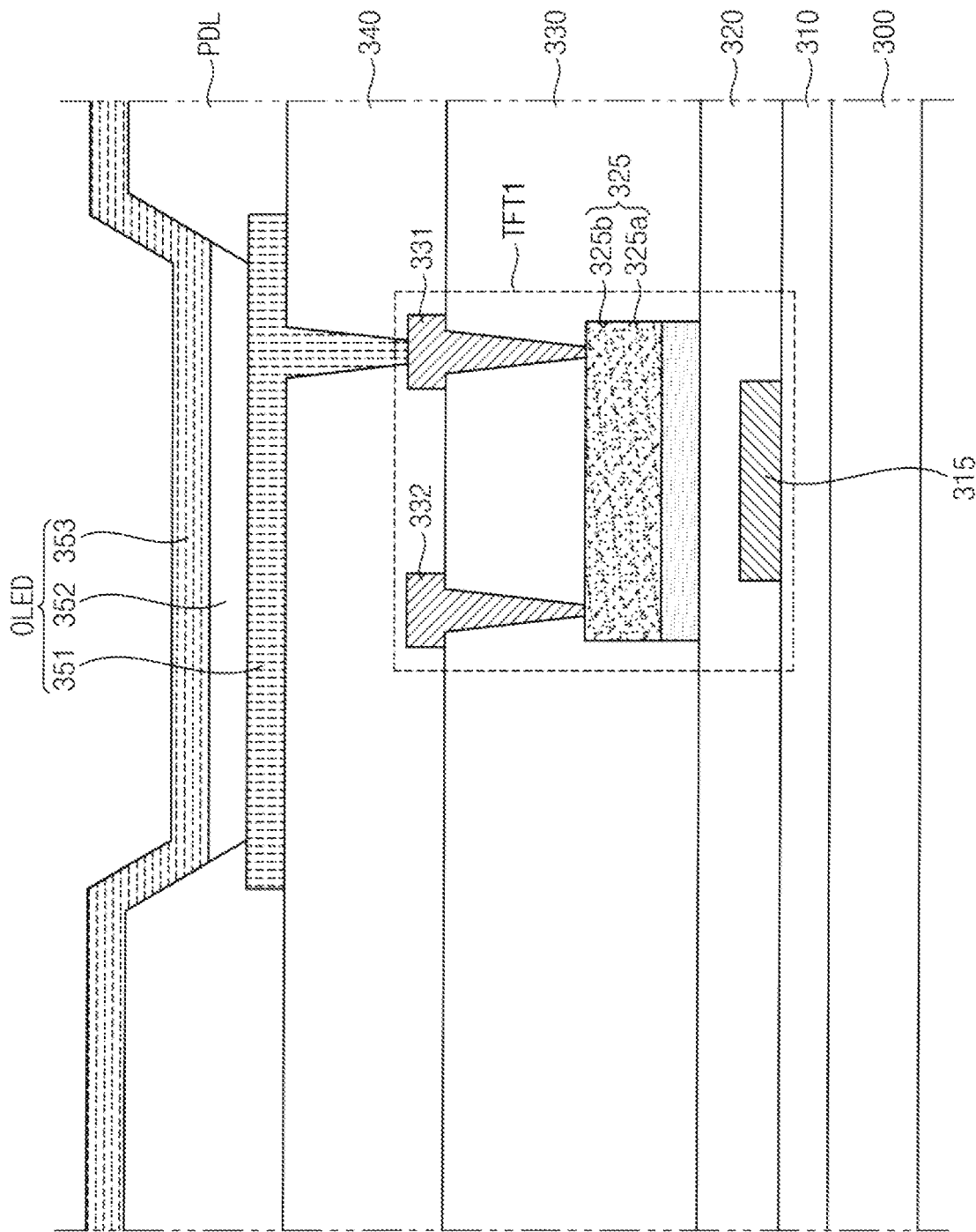

FIG. 5A
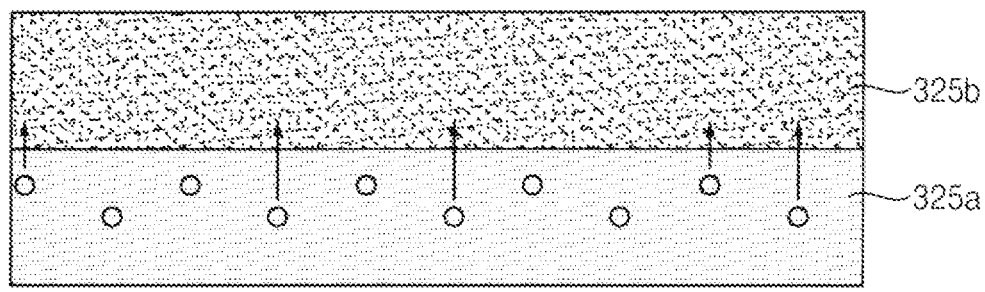
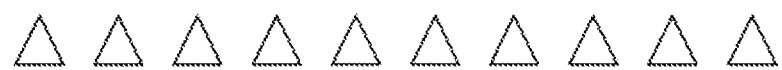
FIG. 5B
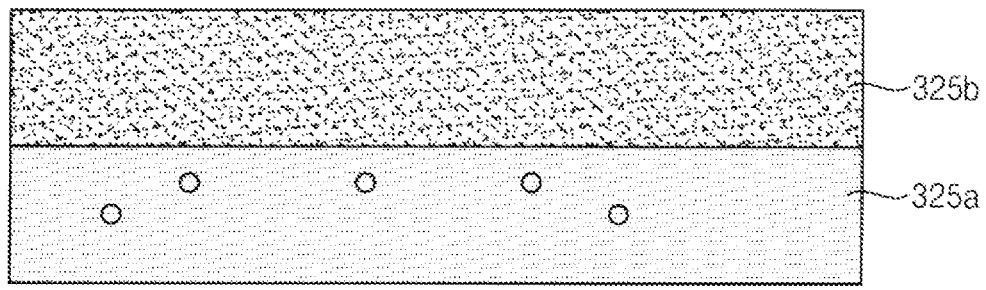

FIG. 10A
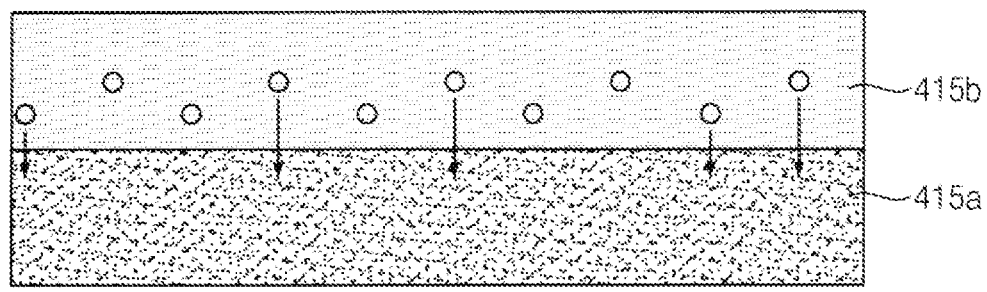
FIG. 10B
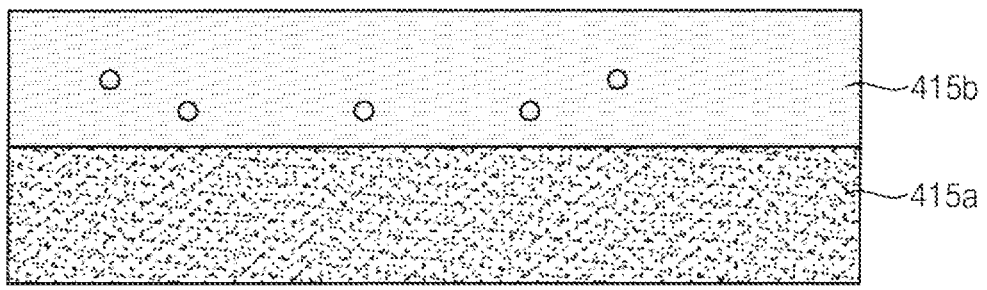

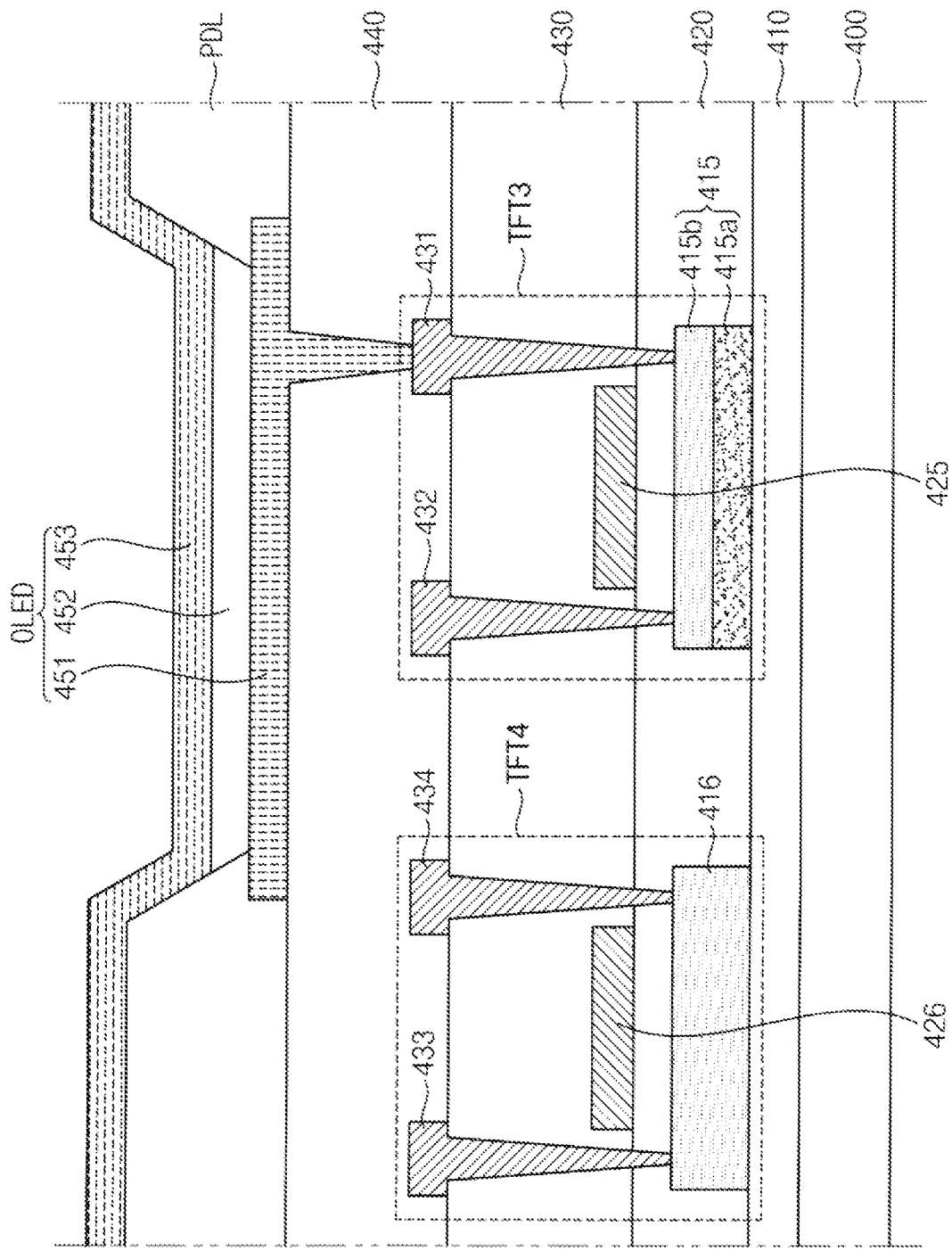

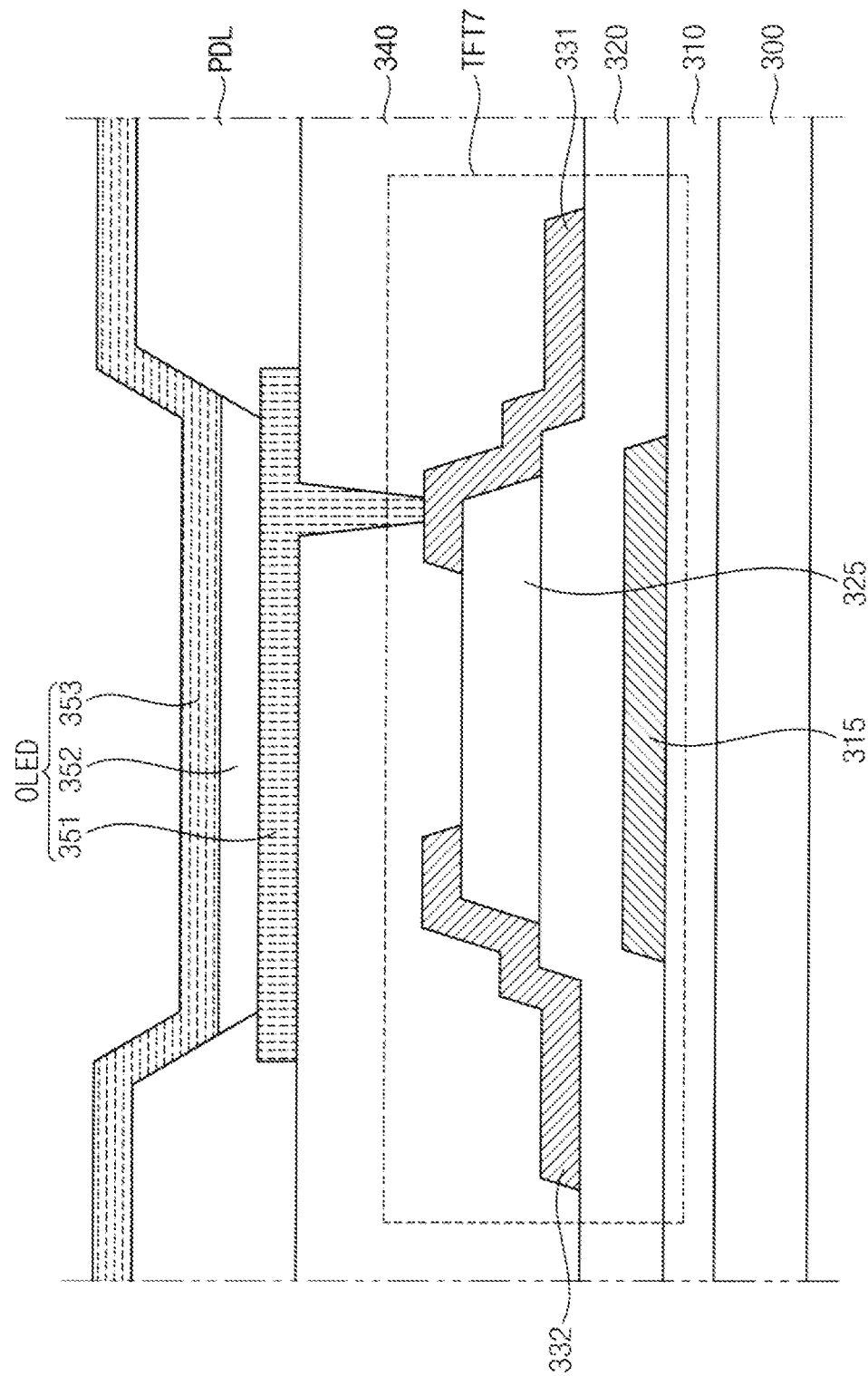

TRANSISTOR AND DISPLAY DEVICE INCLUDING THE SAME

CROSS-REFERENCE TO RELATED APPLICATION

This application claims priority to Korean Patent Application No. 10-2020-0091258 filed on Jul. 22, 2020 and all the benefits accruing therefrom under 35 U.S.C. § 119, the entire disclosure of which is incorporated herein by reference.

BACKGROUND

1. Field

The invention relates to a transistor and a display device including the same, and more particularly, to a display device including an oxide-based semiconductor material.

2. Description of the Related Art

A display device may include pixels and a driver for driving the pixels. Each of the pixels and the driver may include transistors.

Display devices have become relatively large in size. Accordingly, an electrical current is relatively rapidly supplied to components of the display device through the transistors of the display device. In addition, as the performance of the display device increases, the rapidly supplied electrical current supports output of a high-resolution image. Accordingly, transistors having increased electron mobility are being developed.

SUMMARY

The invention provides a transistor having increased electron mobility and including an oxide-based semiconductor material, and a display device including the transistor.

However, the invention is not limited to the embodiments described herein and may be variously extended without departing from the idea and scope of the invention.

According to embodiments, a transistor includes a gate electrode, an active layer on the gate electrode and a source electrode and a drain electrode on the active layer and connected to the active layer. The active layer may include a lower active layer on the gate electrode and including an oxide-based semiconductor material, and an upper active layer on the lower active layer and including the oxide-based semiconductor material and an oxygen-gettering material.

In embodiments, the oxide-based semiconductor material may include at least one selected from zinc oxide, tin oxide, indium oxide, indium-zinc oxide, indium-gallium oxide, zinc-tin oxide and indium-gallium-zinc oxide.

In embodiments, the oxygen-gettering material may include at least one selected from hafnium, strontium, barium, magnesium, lanthanum, yttrium, zirconium and scandium.

In embodiments, a total thickness of the active layer may be approximately 15 nanometers to approximately 60 nanometers.

In embodiments, the lower active layer and the upper active layer may contact each other, and oxygen vacancies in the lower active layer may be greater than oxygen vacancies in the upper active layer.

In embodiments, a content of the oxygen-gettering material included in the upper active layer may be approximately 0.5 atomic percent to approximately 5 atomic percent.

In embodiments, a thickness ratio of the lower active layer to the upper active layer may be approximately 1:4 to approximately 4:1.

According to embodiments, a transistor includes an active layer, a gate electrode on the active layer, and a source electrode and a drain electrode on the gate electrode and connected to the active layer. The active layer may include a lower active layer including an oxide-based semiconductor material and an oxygen-gettering material, and an upper active layer on the lower active layer and including the oxide-based semiconductor material.

In embodiments, the oxide-based semiconductor material may include at least one selected from zinc oxide, tin oxide, indium oxide, indium-zinc oxide, indium-gallium oxide, zinc-tin oxide and indium-gallium-zinc oxide.

In embodiments, the oxygen-gettering material may include at least one selected from hafnium, strontium, barium, magnesium, lanthanum, yttrium, zirconium and scandium.

In embodiments, a total thickness of the active layer may be approximately 15 nanometers to approximately 60 nanometers.

In embodiments, the lower active layer and the upper active layer may contact each other, and oxygen vacancies in the upper active layer may be greater than oxygen vacancies in the lower active layer.

In embodiments, a content of the oxygen-gettering material included in the lower active layer may be approximately 0.5 atomic percent to approximately 5 atomic percent.

In embodiments, a thickness ratio of the lower active layer to the upper active layer may be approximately 1:4 to approximately 4:1.

According to embodiments, a display device may include a substrate, a first transistor on the substrate and including a first active layer, a lower electrode on the first transistor, an intermediate layer on the lower electrode, and an upper electrode on the intermediate layer. The first active layer may include a lower active layer including an oxide-based semiconductor material and an oxygen-gettering material, and an upper active layer on the lower active layer and including the oxide-based semiconductor material.

In embodiments, the oxide-based semiconductor material may include at least one selected from zinc oxide, tin oxide, indium oxide, indium-zinc oxide, indium-gallium oxide, zinc-tin oxide, and indium-gallium-zinc oxide.

In embodiments, the oxygen-gettering material may include at least one selected from hafnium, strontium, barium, magnesium, lanthanum, yttrium, zirconium and scandium.

In embodiments, the lower active layer and the upper active layer may contact each other, and oxygen vacancies in the upper active layer may be greater than oxygen vacancies in the lower active layer.

In embodiments, the display device may further include a second transistor on the substrate and including a second active layer. The second active layer may include a single layer of the oxide-based semiconductor material.

In embodiments, electron mobility of the first transistor may be greater than electron mobility of the second transistor.

In embodiments, the first transistor and the second transistor may be in a same layer as each other.

In embodiments, the display device may further include a second transistor on the substrate and including a second active layer. The second active layer may include a silicon-based semiconductor material, and the second transistor may be connected to the lower electrode.

In embodiments, the first transistor and the second transistor may be in different layers from each other.

According to one or more embodiment, a transistor includes an active layer, and the active layer includes a lower active layer including an oxide-based semiconductor material, and an upper active layer including the oxide-based semiconductor material and an oxygen-gettering material.

The oxygen-gettering material may remove oxygen from the lower active layer so as to increase oxygen vacancies in the lower active layer. Accordingly, electron mobility of the transistor including the active layer may be increased.

However, the invention are not limited to the above effects, and may be variously extended without departing from the idea and scope of the invention.

BRIEF DESCRIPTION OF THE DRAWINGS

The above and other advantages and features of this disclosure will become more apparent by describing in further detail embodiments thereof with reference to the accompanying drawings, in which:

FIG. 3 is a cross-sectional view showing an embodiment of the display device of FIG. 1 taken along line I-I'.

FIG. 4 is a cross-sectional view showing an embodiment of the display device of FIG. 1 taken along line I-I'.

FIGS. 5A and 5B are cross-sectional views showing an embodiment of an active layer in which oxygen included in a lower active layer moves to an upper active layer.

FIGS. 10A and 10B are views showing an embodiment of an active layer in which oxygen included in the upper active layer moves to the lower active layer.

FIG. 11 is a cross-sectional view showing an embodiment of the display device of FIG. 1 taken along line I-I'.

FIG. 13 is a cross-sectional view showing an embodiment of a transistor of FIG. 2.

DETAILED DESCRIPTION

Figure 1:
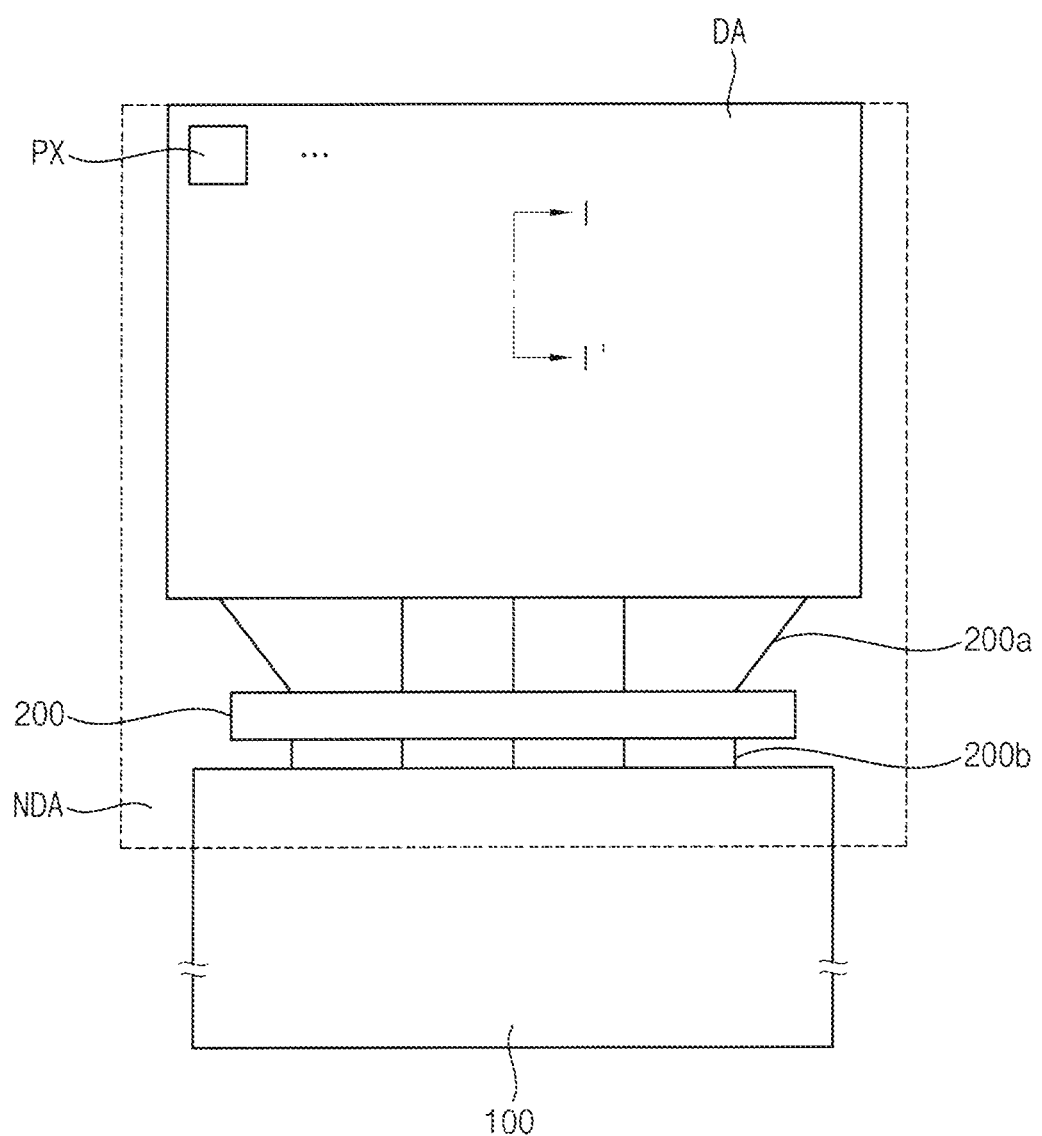
FIG. 1 is a plan view showing an embodiment of a display device.

Hereinafter, embodiments of the invention will be described in more detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. The same reference numerals will be used for the same elements in the drawings, and redundant descriptions of the same elements will be omitted.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross-section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view showing an embodiment of a display device.

Referring to FIG. 1, a display device may include a display area DA and a non-display area NDA which is adjacent to the display area DA. In an embodiment, the non-display area NDA may surround the display area DA. The non-display area NDA may be adjacent to the display area DA in a direction along a plane defined by a first direction (e.g., horizontal direction in FIG. 1) and a second direction (e.g., vertical direction in FIG. 1) which cross each other. The display device and various components thereof may be disposed in the plane defined by the first and second directions crossing each other. A thickness of the display device and various components thereof may be defined along a third direction which crosses each of the first and second directions.

A pixel PX provided in plural including a plurality of pixels PX may be disposed in the display area DA. In embodiments, the pixels PX may be arranged in the form of a matrix. However, since the above configuration is provided for illustrative purposes, the pixels PX may be arranged in various schemes.

A driver 200 may be disposed in the non-display area NDA. The driver 200 may drive the pixels PX. The driver 200 may receive signals (e.g., electrical signals) through a transmission wire 200b which is provided in plural including a plurality of transmission wires 200b. The driver 200 may transmit the signals to the display area DA through a fan-out wire 200a provided in plural including a plurality of fan-out wires 200a.

In addition, a circuit film 100 may be disposed in the non-display area NDA. The circuit film 100 may receive the signals from outside thereof. The signals received by the circuit film 100 may be transmitted to the display area DA through the transmission wires 200b, the driver 200 and the fan-out wires 200a. The display area DA may display an image corresponding to the signals.

Figure 2:
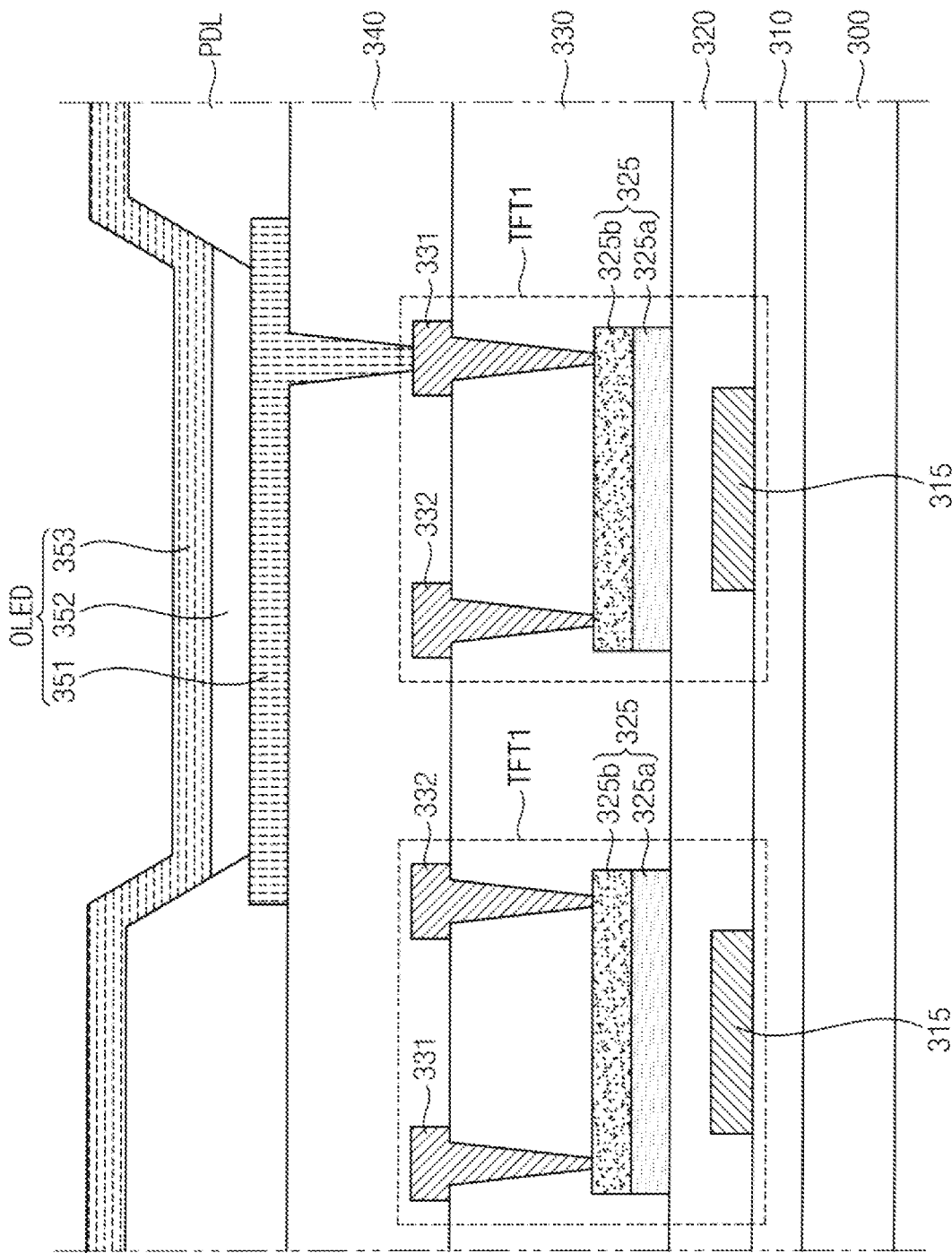
FIG. 2 is a cross-sectional view showing an embodiment of the display device of FIG. 1 taken along line I-I'.

FIGS. 2, 3 and 4 are cross-sectional views respectively showing embodiments of the display device of FIG. 1 taken along line I-I'. FIGS. 5A and 5B are cross-sectional views showing an embodiment in which oxygen included in a lower active layer moves to an upper active layer.

Referring to FIGS. 2 to 5B, the display device may include a substrate 300, a buffer layer 310, a gate insulating layer 320, an interlayer insulating layer 330, a via insulating layer 340, a pixel defining layer PDL, a display element such as an organic light emitting diode OLED and a first transistor TFT1. The organic light emitting diode OLED may include a lower electrode 351, an intermediate layer 352 and an upper electrode 353 facing the lower electrode 351 with the intermediate layer 352 therebetween. The first transistor TFT1 may include a gate electrode 315 (e.g., a first gate electrode), an active layer 325 (e.g., first active layer), a source electrode 331 (e.g., first source electrode) and a drain electrode 332 (e.g., a first drain electrode). In embodiments, the active layer 325 may include a lower active layer 325a and an upper active layer 325b which faces the lower active layer 325a.

The substrate 300 may include a transparent or opaque material. The substrate 300 may include a rigid material. In an embodiment, for example, the substrate 300 may include a quartz substrate, a synthetic quartz substrate, a calcium fluoride substrate, a fluorine-doped quartz substrate, a soda lime glass substrate, a non-alkali glass substrate and the like. In addition, the substrate 300 may include a material having ductility.

The buffer layer 310 may be disposed on the substrate 300. The buffer layer 310 may reduce or effectively prevent diffusion of metal atoms or impurities from the substrate 300 to the first transistor TFT1 and/or the organic light emitting diode OLED. In addition, when a surface of the substrate 300 is not uniform or uneven, the buffer layer 310 may serve to improve flatness of the surface of the substrate 300. The buffer layer 310 may include silicon, metal oxide and the like.

The gate electrode 315 may be disposed on the buffer layer 310. The gate electrode 315 may include a metal, an alloy, metal nitride, conductive metal oxide, a transparent conductive material and the like. In an embodiment, for example, the gate electrode 315 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum (Al) alloy, aluminum nitride ($AlN_x$), a silver (Ag) alloy, tungsten (W), tungsten nitride ($WN_x$), a copper (Cu) alloy, a molybdenum (Mo) alloy, titanium nitride ($TiN_x$), tantalum nitride ($TaN_x$), strontium ruthenium oxide ($SrRu_xO_y$), zinc oxide ($ZnO_x$), indium-tin oxide ("ITO"), tin oxide ($SnO_x$), indium oxide ($InO_x$), gallium oxide ($GaO_x$), indium-zinc oxide ("IZO") and the like. These may be used alone or in combination with each other.

The gate insulating layer 320 may be disposed on the buffer layer 310 to cover the gate electrode 315. The gate insulating layer 320 may include silicon, metal oxide and the like. In an embodiment for example, the gate insulating layer 320 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$) and the like. In embodiments, the gate insulating layer 320 may have a flat top surface. In embodiments, the gate insulating layer 320 may include or be formed along a profile of the gate electrode 315 to have a uniform thickness providing the flat top surface with respect to a reference such as an upper surface of the substrate 300.

The lower active layer 325a may be disposed on the gate insulating layer 320. The lower active layer 325a may include an oxide-based semiconductor material (e.g., an oxide semiconductor material as including or containing oxide). The lower active layer 325a may exclude an oxygen-gettering material. In embodiments, the lower active layer 325a may include at least one selected from zinc oxide ($ZnO_x$), tin oxide ($SnO_x$), indium oxide ($InO_x$), indium-zinc oxide ("IZO"), indium-gallium oxide ("IGO"), zinc-tin oxide ($ZnSn_xO_y$) and indium-gallium-zinc oxide ("IGZO").

The upper active layer 325b may be disposed on the lower active layer 325a. In embodiments, the upper active layer 325b may make contact with the lower active layer 325a. As being in contact, elements may form an interface therebetween. The upper active layer 325b may include the oxide-based semiconductor material and an oxygen-gettering material. In an embodiment, for example, the upper active layer 325b may include at least one selected from hafnium (Hf), strontium (Sr), barium (Ba), magnesium (Mg), lanthanum (La), yttrium (Y), zirconium (Zr) and scandium (Sc) as the oxygen-gettering material. In an embodiment, for example, the upper active layer 325b may include the oxide-based semiconductor material doped with the oxygen-gettering material. In embodiments, the content of the oxygen-gettering material included in the upper active layer 325b may be approximately 0.5 atomic percent to approximately 5 atomic percent.

As shown in FIGS. 5A and 5B, the upper active layer 325b includes the oxygen-gettering material, so that the upper active layer 325b may reduce the content of oxygen included in the lower active layer 325a. In a method of providing the display device, a process of thermally treating (as indicated by triangles in FIG. 10A) the lower active layer 325a and the upper active layer 325b may move the oxygen included in the lower active layer 325a to the upper active layer 325b. Thus, oxygen vacancies in the lower active layer 325a may be increased, so that electron mobility of the lower active layer 325a may be increased. Accordingly, electron mobility and electrical reliability of the first transistor TFT1 may be improved. The oxygen which is moved to the upper active layer 325b increases the content of oxygen included in the upper active layer 325b. In embodiments, the oxygen vacancies in the lower active layer 325a may be greater than oxygen vacancies in the upper active layer 325b.

In embodiments, the lower active layer 325a may include indium-gallium-zinc oxide ("IGZO"), and the upper active layer 325b may include a material in which the indium-gallium-zinc oxide ("IGZO") is doped with the hafnium (Hf). However, since the above configuration is provided for illustrative purposes, the lower active layer 325a may include at least one among oxide-based semiconductor materials, and the upper active layer 325b may include the respective oxide-based semiconductor material doped with at least one of the oxygen-gettering materials.

In embodiments, a total thickness of the active layer 325 along a thickness direction may be approximately 15 nanometers (nm) to approximately 60 nm. A thickness ratio of the lower active layer 325a to the upper active layer 325b may be approximately 1:4 to 4:1. As shown in FIG. 3, a thickness of the lower active layer 325a may be greater than a thickness of the upper active layer 325b. As shown in FIG. 4, the thickness of the upper active layer 325b may be greater than the thickness of the lower active layer 325a. As described above, the thickness ratio of the lower active layer 325a to the upper active layer 325b may vary, so that the performance (e.g., the electron mobility, an on/off ratio, etc.) of the first transistor TFT1 including the active layer 325 may be improved. The above configurations will be described for illustrative purposes with reference to the following table.

TABLE 1

| Thickness of upper active layer 325b: Thickness of lower active layer 325a | Mobility | Subthreshold swing | On/off ratio |
|---|---|---|---|
| Reference | 1 | 1 | 1 |
| 3:1 | 1.26 | 0.98 | 1.15 |
| 2:1 | 3.45 | 0.67 | 460.84 |
| 1:1 | 2.87 | 0.81 | 4.85 |
| 1:2 | 1.58 | 0.81 | 2.69 |

Table 1 shows results of performance tests for the first transistor TFT1 which have been performed while varying the thickness ratio of the lower active layer 325a to the upper active layer 325b when a total thickness of the active layer 325 is approximately 50 nm. Results for the reference may refer to results for a reference transistor including a reference active layer having a single layer including IGZO without including hafnium (Hf). Table 1 shows the results when values of electron mobility, subthreshold swing and an on/off ratio for the reference transistor are set as 1, respectively. When each of the values of the electron mobility and the on/off ratio is greater than 1, the values may represent that the performance of the first transistor TFT1 is excellent as compared to the reference transistor. As the value of the subthreshold swing becomes less than 1, the value may represent that the performance of the first transistor TFT1 is better than the reference transistor.

In embodiments, since the upper active layer 325b includes the oxygen-gettering material (e.g., hafnium), it was found that the performance of the first transistor TFT1 including the active layer 325 is improved as compared with the reference transistor.

In addition, in embodiments, even when the thickness ratio of the upper active layer 325b and the lower active layer 325a varies, it was found that the performance of the first transistor TFT1 is improved as compared with the reference transistor.

Although the performance of the first transistor TFT1 when the total thickness of the active layer 325 is approximately 50 nm has been shown in Table 1 for illustrative purposes, the performance of the first transistor TFT1 may be better than the reference transistor even when the thickness of the active layer 325 is approximately 15 nm to approximately 60 nm. In addition, although the test has been performed when the thickness ratio of the upper active layer 325b to the lower active layer 325a is 3:1 to 1:2, embodiments are not limited thereto, and the performance of the first transistor TFT1 may be better than the reference transistor even when the thickness ratio of the upper active layer 325b to the lower active layer 325a is 4:1 to 1:4. This can be applied similarly to various transistors that will be described below.

The interlayer insulating layer 330 may be disposed on the gate insulating layer 320 to cover the active layer 325. The interlayer insulating layer 330 may include silicon, metal oxide and the like. In embodiments, the interlayer insulating layer 330 may have a flat top surface. In embodiments, the interlayer insulating layer 330 may be provided or formed along a profile of the active layer 325 to have a uniform thickness which provides the flat top surface.

The source electrode 331 and the drain electrode 332 may be disposed on the interlayer insulating layer 330. The source electrode 331 may be connected to a source region of the active layer 325 through a contact hole provided or formed at a region excluding a part of the interlayer insulating layer 330. The drain electrode 332 may be connected to a drain region of the active layer 325 through a contact hole provided or formed at a region excluding a part of the interlayer insulating layer 330. The source electrode 331 and the drain electrode 332 may include or be formed of a conductive material such as molybdenum (Mo), copper (Cu), aluminum (Al) or titanium (Ti).

In embodiments, the display device may include the first transistor TFT1 provided in plural including a plurality of first transistors TFT1. Some of the first transistors TFT1 may operate as switching transistors and some of the first transistors TFT1 may operate as driving transistors. In an embodiment, for example, when a first portion of the first transistors TFT1 operate as the driving transistors, the first portion of the first transistors TFT1 may be connected to the organic light emitting diode OLED.

The via insulating layer 340 may be disposed on the interlayer insulating layer 330 to cover the source electrode 331 and the drain electrode 332. In embodiments, the via insulating layer 340 may be subject to a planarization process to arrange the organic light emitting diode OLED. Accordingly, the via insulating layer 340 may have a flat top surface. The via insulating layer 340 may include silicon, metal oxide and the like. In addition, the via insulating layer 340 may include or be formed of an organic insulating material such as polyimide ("PI").

The lower electrode 351 may be disposed on the via insulating layer 340. The lower electrode 351 may be connected to the first transistor TFT1 that operates as the driving transistor, through a contact hole provided or formed at a region excluding a part of the via insulating layer 340. In embodiments, the lower electrode 351 may be connected to the source electrode 331. The lower electrode 351 may include or be formed of a conductive material such as a metal, an alloy or transparent conductive oxide. In an embodiment, for example, the conductive material may include silver (Ag), indium-tin oxide ("ITO") and the like.

The pixel defining layer PDL may be disposed on the via insulating layer 340. The pixel defining layer PDL may cover an edge of the lower electrode 351, and may define a pixel opening that exposes a top surface of the lower electrode 351 to outside the pixel defining layer PDL. The pixel defining layer PDL may include or be formed of an organic insulating material such as polyimide ("PI").

The intermediate layer 352 may be disposed on the lower electrode 351. The intermediate layer 352 may be disposed on the lower electrode 351 exposed by the pixel opening to outside the pixel defining layer PDL. The intermediate layer 352 may include at least one of an organic light emitting material and a quantum dot.

In embodiments, the organic light emitting material may include a low molecular weight organic compound or a high molecular weight organic compound. In an embodiment, for example, the low molecular weight organic compound may include copper phthalocyanine, N,N'-diphenylbenzidine, tris-(8-hydroxyquinoline)aluminum and the like, and the high molecular weight organic compound may include poly (3,4-ethylenedioxythiophene), polyaniline, poly-phenylenevinylene, polyfluorene and the like.

In embodiments, the quantum dot may include a core including a group II-VI compound, a group III-V compound, a group IV-VI compound, a group IV element, a group IV compound, and a combination thereof. In embodiments, the quantum dot may have a core-shell structure including a core and a shell surrounding the core. The shell may serve as a protective layer for maintaining semiconductor characteristics by reducing or effectively preventing chemical modification of the core, and serve as a charging layer for imparting electrophoretic characteristics to the quantum dot.

The upper electrode 353 may be disposed on the intermediate layer 352. In embodiments, the upper electrode 353 may be disposed on the pixel defining layer PDL. The upper electrode 353 may include or be formed of a conductive material such as a metal, an alloy or transparent conductive oxide. In an embodiment, for example, the conductive material may include aluminum (Al), platinum (Pt), silver (Ag), magnesium (Mg), gold (Au), chromium (Cr), tungsten (W), titanium (Ti) and the like.

Figure 6:
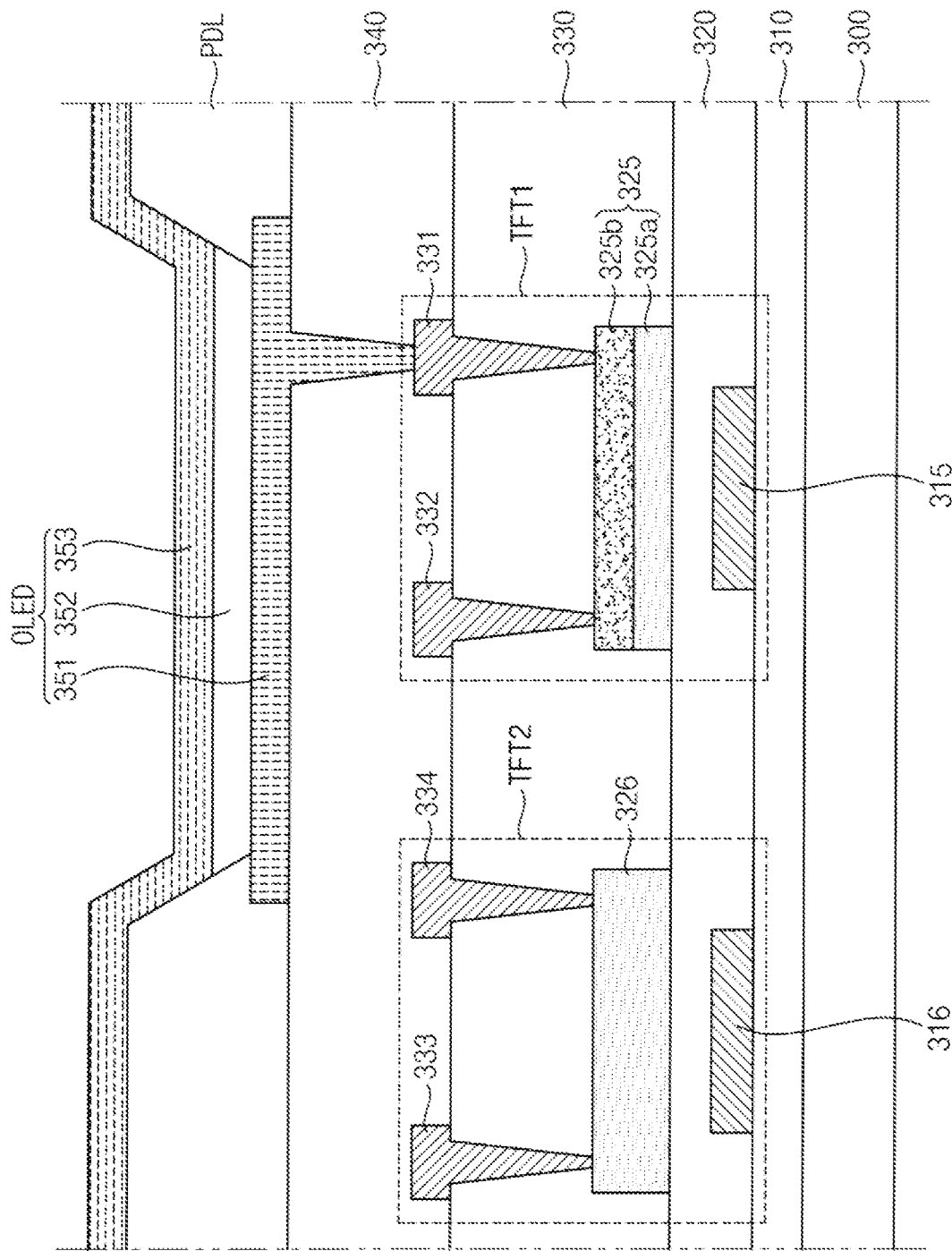
FIG. 6 is a cross-sectional view showing an embodiment of the display device of FIG. 1 taken along line I-I'.

FIG. 6 is a cross-sectional view showing an embodiment of the display device of FIG. 1 taken along line I-I'. FIG. 6 may be substantially the same as FIG. 2 except for a second transistor TFT2. Therefore, descriptions of redundant components will be omitted.

Referring to FIGS. 3 and 6, the display device may include the substrate 300, the buffer layer 310, the gate insulating layer 320, the interlayer insulating layer 330, the via insulating layer 340, the first transistor TFT1, the second transistor TFT2, the pixel defining layer PDL and the organic light emitting diode OLED.

The second transistor TFT2 may include a gate electrode 316 (e.g., second gate electrode), an active layer 326 (e.g., second active layer), a source electrode 333 (e.g., second source electrode) and a drain electrode 334 (e.g., second drain electrode). The second transistor TFT2 may have a structure that is substantially the same as the structure of the first transistor TFT1 except for a structure of the active layer 326. In embodiments, the first transistor TFT1 and the second transistor TFT2 and various elements respectively thereof may be disposed in a the same layer. As being in a same layer, elements may be respective portions or patterns of a same material layer. In FIG. 6, for example, the gate electrode 315 and the gate electrode 316 may be in a same layer as each other as being respective patterns of a same material layer on the substrate 300.

The active layer 326 may be disposed on the gate insulating layer 320. The active layer 326 may be a single layer including the oxide-based semiconductor material. In an embodiment, for example, the active layer 326 may include indium (In), zinc (Zn), gallium (Ga), tin (Sn), titanium (Ti), aluminum (Al), zirconium (Zr) and the like. In addition, the active layer 326 may include at least one selected from zinc oxide ($ZnO_x$), tin oxide ($SnO_x$), indium oxide ($InO_x$), indium-zinc oxide ("IZO"), indium-gallium oxide ("IGO"), zinc-tin oxide ($ZnSn_xO_y$) and indium-gallium-zinc oxide ("IGZO").

Due to the active layer 326 having only a single layer of the oxide-based semiconductor material, the second transistor TFT2 may have electron mobility that is lower than the electron mobility of the first transistor TFT1. In other words, the electron mobility of the first transistor TFT1 may be higher than the electron mobility of the second transistor TFT2. However, the second transistor TFT2 may be provided or manufactured through a manufacturing process that is simpler than a process which provides the first transistor TFT1.

In embodiments, the first transistor TFT1 may operate as a driving transistor, and the second transistor TFT2 may operate as a switching transistor. However, embodiments are not limited thereto, and the second transistor TFT2 may operate as a driving transistor and the first transistor TFT1 may operate as a switching transistor.

Figure 7:
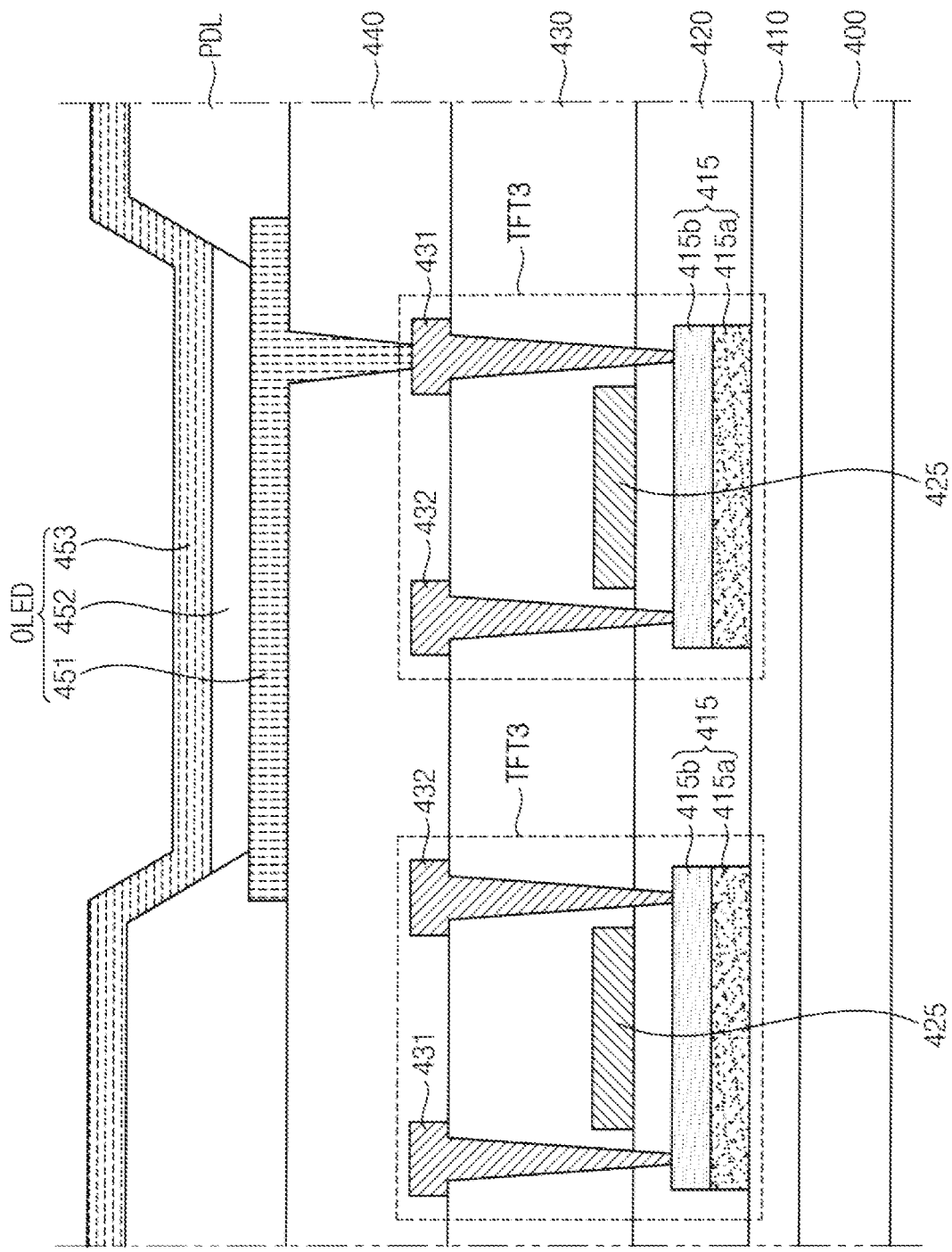
FIG. 7 is a cross-sectional view showing an embodiment of the display device of FIG. 1 taken along line I-I'.
Figure 8:
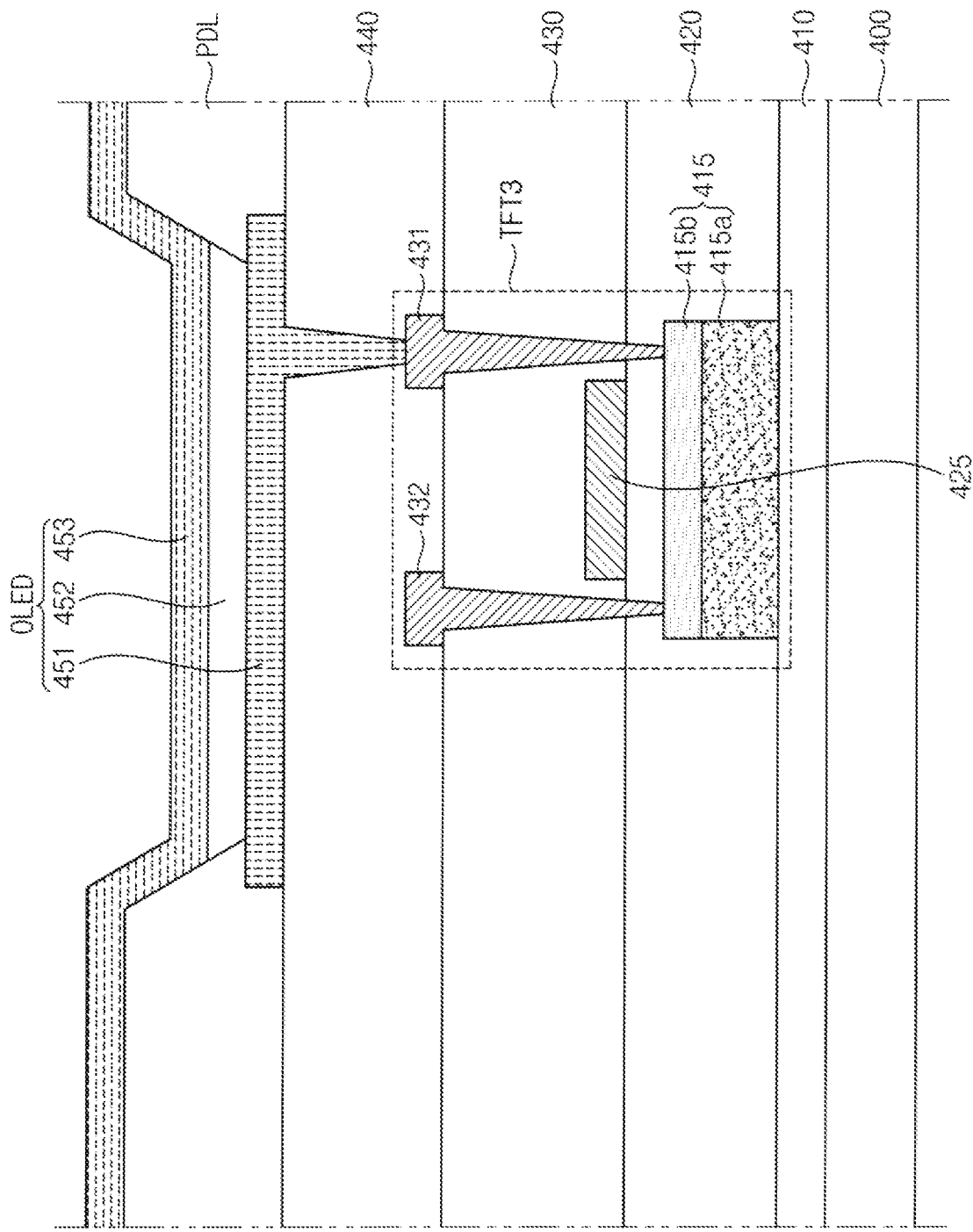
FIG. 8 is a cross-sectional view showing an embodiment of the display device of FIG. 1 taken along line I-I'.
Figure 9:
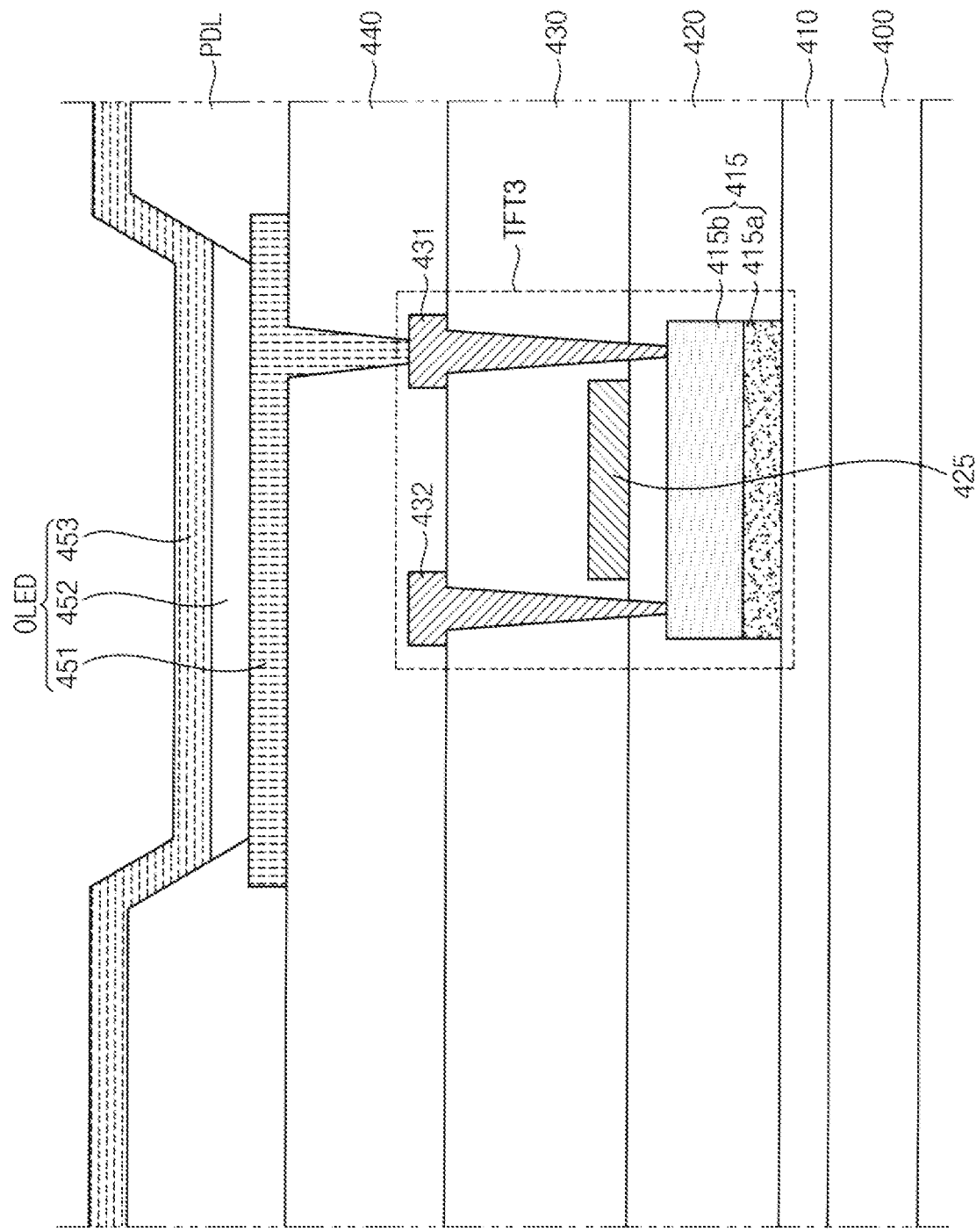
FIG. 9 is a cross-sectional view showing an embodiment of the display device of FIG. 1 taken along line I-I'.

FIGS. 7, 8 and 9 are cross-sectional views showing respective embodiments of the display device of FIG. 1 taken along line I-I'. FIGS. 10A and 10B are cross-sectional views showing an embodiment in which oxygen included in a respective upper active layer moves to a respective lower active layer.

Referring to FIGS. 7 to 10B, the display device may include a substrate 400, a buffer layer 410, a gate insulating layer 420, an interlayer insulating layer 430, a via insulating layer 440, a pixel defining layer PDL, an organic light emitting diode OLED, and a third transistor TFT3. The organic light emitting diode OLED may include a lower electrode 451, an intermediate layer 452 and an upper electrode 453. The third transistor TFT3 may include an active layer 415, a gate electrode 425, a source electrode 431 and a drain electrode 432. In embodiments, the active layer 415 may include a lower active layer 415a and an upper active layer 415b.

The substrate 400 may include a transparent or opaque material. The substrate 400 may include a rigid material. In an embodiment, for example, the substrate 400 may include a quartz substrate, a synthetic quartz substrate, a calcium fluoride substrate, a fluorine-doped quartz substrate, a soda lime glass substrate, a non-alkali glass substrate and the like. In addition, the substrate 400 may include a material having ductility.

The buffer layer 410 may be disposed on the substrate 400. The buffer layer 410 may reduce or effectively prevent diffusion of metal atoms or impurities from the substrate 400 to the third transistor TFT3 and/or the organic light emitting diode OLED. In addition, when a surface of the substrate 400 is not uniform or uneven, the buffer layer 410 may serve to improve flatness of the surface of the substrate 400. The buffer layer 410 may include silicon, metal oxide and the like.

The lower active layer 415a may be disposed on the buffer layer 410. The lower active layer 415a may include an oxide-based semiconductor material and an oxygen-gettering material. In embodiments, the lower active layer 415a may include at least one selected from zinc oxide ($ZnO_x$), tin oxide ($SnO_x$), indium oxide ($InO_x$), indium-zinc oxide ("IZO"), indium-gallium oxide ("IGO"), zinc-tin oxide ($ZnSn_xO_y$) and indium-gallium-zinc oxide ("IGZO") as the oxide-based semiconductor material. In embodiments, the lower active layer 415a may include at least one selected from hafnium (Hf), strontium (Sr), barium (Ba), magnesium (Mg), lanthanum (La), yttrium (Y), zirconium (Zr) and scandium (Sc) as the oxygen-gettering material. In an embodiment, for example, the lower active layer 415a may include the oxide-based semiconductor material doped with the oxygen-gettering material. In embodiments, the content of the oxygen-gettering material included in the lower active layer 415a may be approximately 0.5 atomic percent to approximately 5 atomic percent.

The upper active layer 415b may be disposed on the lower active layer 415a. The upper active layer 415b may make contact with the lower active layer 415a. The upper active layer 415b may include the oxide-based semiconductor material. The upper active layer 415b may exclude an oxygen-gettering material.

As shown in FIGS. 10A and 10B, the lower active layer 415a includes the oxygen-gettering material, so that the lower active layer 415a may reduce the content of oxygen included in the upper active layer 415b. In a process of thermally treating the upper active layer 415b and the lower active layer 415a, the oxygen included in the upper active layer 415b may move to the lower active layer 415a. Thus, oxygen vacancies in the upper active layer 415b may be increased, so that electron mobility of the upper active layer 415b may be increased. Accordingly, electron mobility and electrical reliability of the third transistor TFT3 may be improved. The oxygen which is moved to the lower active layer 415a increases the content of oxygen included in the lower active layer 415a. In addition, the oxygen vacancies in the upper active layer 415b may be greater than oxygen vacancies in the lower active layer 415a.

In embodiments, the upper active layer 415b may include the indium-gallium-zinc oxide ("IGZO"), and the lower active layer 415a may include a material in which the indium-gallium-zinc oxide ("IGZO") is doped with the hafnium (Hf). However, since the above configuration is provided for illustrative purposes, the upper active layer 415b may include at least one among the oxide-based semiconductor materials, and the lower active layer 415a may include the respective oxide-based semiconductor material doped with at least one of the oxygen-gettering materials.

In embodiments, a total thickness of the active layer 415 may be approximately 15 nm to approximately 60 nm. A thickness ratio of the lower active layer 415a to the upper active layer 415b may be approximately 1:4 to 4:1. As shown in FIG. 8, a thickness of the lower active layer 415a may be greater than a thickness of the upper active layer 415b. As shown in FIG. 9, the thickness of the upper active layer 415b may be greater than the thickness of the lower active layer 415a.

The gate insulating layer 420 may be disposed on the buffer layer 410 to cover the active layer 415. The gate insulating layer 420 may include silicon, metal oxide and the like. In an embodiment, for example, the gate insulating layer 420 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$) and the like. In embodiments, the gate insulating layer 420 may have a flat top surface. In embodiments, the gate insulating layer 420 may be provided or formed along a profile of the active layer 415 to have a uniform thickness.

The gate electrode 425 may be disposed on the gate insulating layer 420. The gate electrode 425 may include a metal, an alloy, metal nitride, conductive metal oxide, a transparent conductive material and the like. In an embodiment, for example, the gate electrode 425 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum (Al) alloy, aluminum nitride ($AlN_x$), a silver (Ag) alloy, tungsten (W), tungsten nitride ($WN_x$), a copper (Cu) alloy, a molybdenum (Mo) alloy, titanium nitride ($TiN_x$), tantalum nitride ($TaN_x$), strontium ruthenium oxide ($SrRu_xO_y$), zinc oxide ($ZnO_x$), indium-tin oxide ("ITO"), tin oxide ($SnO_x$), indium oxide ($InO_x$), gallium oxide ($GaO_x$), indium-zinc oxide ("IZO") and the like. These may be used alone or in combination with each other.

The interlayer insulating layer 430 may be disposed on the gate insulating layer 420 to cover the gate electrode 425. The interlayer insulating layer 430 may include silicon, metal oxide and the like. In embodiments, the interlayer insulating layer 430 may have a flat top surface. In embodiments, the interlayer insulating layer 430 may be provided or formed along a profile of the gate electrode 425 to have a uniform thickness.

The source electrode 431 and the drain electrode 432 may be disposed on the interlayer insulating layer 430. The source electrode 431 may be connected to a source region of the active layer 415 through a contact hole provided or formed at a region excluding a part of the interlayer insulating layer 430 and the gate insulating layer 420. The drain electrode 432 may be connected to a drain region of the active layer 415 through a contact hole provided or formed at a region excluding a part of the interlayer insulating layer 430 and the gate insulating layer 420. The source electrode 431 and the drain electrode 432 may include or be formed of a conductive material such as molybdenum (Mo), copper (Cu), aluminum (Al) or titanium (Ti).

In embodiments, the display device may include the third transistor TFT3 provided in plural including a plurality of third transistors TFT3. Some of the third transistors TFT3 may operate as switching transistors, and some of the third transistors TFT3 may operate as driving transistors. The driving transistors may be connected to the organic light emitting diode OLED.

The via insulating layer 440 may be disposed on the interlayer insulating layer 430 to cover the source electrode 431 and the drain electrode 432. In embodiments, the via insulating layer 440 may be subject to a planarization process to arrange the organic light emitting diode OLED. Accordingly, the via insulating layer 440 may have a flat top surface. The via insulating layer 440 may include silicon, metal oxide and the like. In addition, the via insulating layer 440 may include or be formed of an organic insulating material such as polyimide ("PI").

The lower electrode 451 may be disposed on the via insulating layer 440. The lower electrode 451 may be connected to the third transistor TFT3 that operates as the driving transistor through a contact hole provided or formed at a region excluding a part of the via insulating layer 440. In embodiments, the lower electrode 451 may be connected to the source electrode 431. The lower electrode 451 may include or be formed of a conductive material such as a metal, an alloy or transparent conductive oxide. In an embodiment, for example, the conductive material may include silver (Ag), indium-tin oxide ("ITO") and the like.

The pixel defining layer PDL may be disposed on the via insulating layer 440. The pixel defining layer PDL may cover an edge of the lower electrode 451, and may define a pixel opening that exposes a top surface of the lower electrode 451 to outside the pixel defining layer PDL. The pixel defining layer PDL may include or be formed of an organic insulating material such as polyimide ("PI").

The intermediate layer 452 may be disposed on the lower electrode 451. The intermediate layer 452 may be disposed on the lower electrode 451 exposed by the pixel opening to outside the pixel defining layer PDL. The intermediate layer 452 may include at least one of an organic light emitting material and a quantum dot.

The upper electrode 453 may be disposed on the intermediate layer 452. In embodiments, the upper electrode 453 may be disposed on the pixel defining layer PDL. The upper electrode 453 may include or be formed of a conductive material such as a metal, an alloy or transparent conductive oxide. In an embodiment, for example, the conductive material may include aluminum (Al), platinum (Pt), silver (Ag), magnesium (Mg), gold (Au), chromium (Cr), tungsten (W), titanium (Ti) and the like.

FIG. 11 is a cross-sectional view showing an embodiment of the display device of FIG. 1 taken along line I-I'. FIG. 11 may be substantially the same as FIG. 7 except for a fourth transistor TFT4. Therefore, descriptions of redundant components will be omitted.

Referring to FIGS. 7 and 11, the display device may include the substrate 400, the buffer layer 410, the gate insulating layer 420, the interlayer insulating layer 430, the via insulating layer 440, the third transistor TFT3, the fourth transistor TFT4, the pixel defining layer PDL and the organic light emitting diode OLED.

The fourth transistor TFT4 may include an active layer 416, a gate electrode 426, a source electrode 433 and a drain electrode 434. The fourth transistor TFT4 may have a structure that is substantially the same as the structure of the third transistor TFT3 except for a structure of the active layer 416. In embodiments, the third transistor TFT3 and the fourth transistor TFT4 may be disposed in the same layer.

The active layer 416 may be disposed on the buffer layer 410. The active layer 416 may be a single layer including an oxide-based semiconductor material. In an embodiment, for example, the active layer 416 may include indium (In), zinc (Zn), gallium (Ga), tin (Sn), titanium (Ti), aluminum (Al), zirconium (Zr) and the like. In addition, the active layer 416 may include at least one selected from zinc oxide ($ZnO_x$), tin oxide ($SnO_x$), indium oxide ($InO_x$), indium-zinc oxide ("IZO"), indium-gallium oxide ("IGO"), zinc-tin oxide ($ZnSn_xO_y$) and indium-gallium-zinc oxide ("IGZO").

Due to the active layer 416 having only a single layer of the oxide-based semiconductor material, the fourth transistor TFT4 may have electron mobility that is lower than the electron mobility of the third transistor TFT3. In other words, the electron mobility of the third transistor TFT3 may be higher than the electron mobility of the fourth transistor TFT4. However, the fourth transistor TFT4 may be provided or manufactured through a manufacturing process that is simpler than a process which provides the third transistor TFT3.

Figure 12:
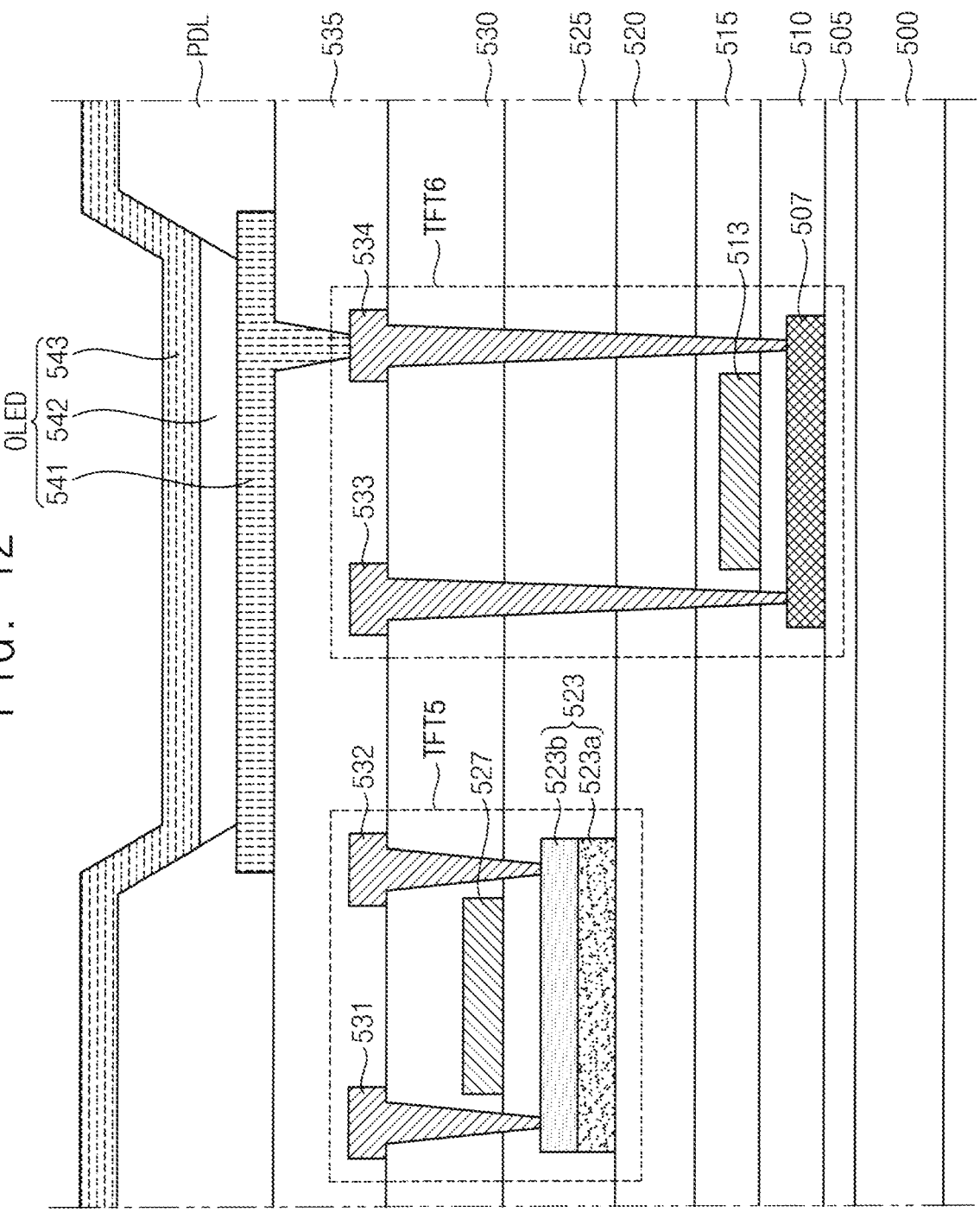
FIG. 12 is a cross-sectional view showing an embodiment of the display device of FIG. 1 taken along line I-I'.

FIG. 12 is a cross-sectional view showing an embodiment of the display device of FIG. 1 taken along line I-I'.

Referring to FIG. 12, the display device may include a substrate 500, a buffer layer 505, a first gate insulating layer 510, a first interlayer insulating layer 515, a second interlayer insulating layer 520, a second gate insulating layer 525, a third interlayer insulating layer 530, a via insulating layer 535, a pixel defining layer PDL, a fifth transistor TFT5, a sixth transistor TFT6 and an organic light emitting diode OLED. The fifth transistor TFT5 may include a gate electrode 527, an active layer 523, a source electrode 531 and a drain electrode 532. The active layer 523 may include a lower active layer 523a and an upper active layer 523b. The sixth transistor TFT6 may include a gate electrode 513, an active layer 507, a source electrode 533 and a drain electrode 534. In embodiments, the fifth transistor TFT5 and the sixth transistor TFT6 may be disposed in different layers from each other. That is, similar elements such respective gate electrodes or respective active layers are in different layers from each other.

The substrate 500 may include a transparent or opaque material. The substrate 500 may include a rigid material. In an embodiment, for example, the substrate 500 may include a quartz substrate, a synthetic quartz substrate, a calcium fluoride substrate, a fluorine-doped quartz substrate, a soda lime glass substrate, a non-alkali glass substrate and the like. In addition, the substrate 500 may include a material having ductility.

The buffer layer 505 may be disposed on the substrate 500. The buffer layer 505 may be disposed over an entirety of the substrate 500. The buffer layer 505 may reduce or effectively prevent diffusion of metal atoms or impurities from the substrate 500 to the fifth transistor TFT5 and the sixth transistor TFT6. In addition, when a surface of the substrate 500 is not uniform, the buffer layer 505 may serve to improve flatness of the surface of the substrate 500. The buffer layer 505 may include silicon, metal oxide and the like.

The active layer 507 may be disposed on the buffer layer 505. The active layer 507 may include a silicon-based semiconductor material (e.g., silicon semiconductor material as including or containing silicon). In an embodiment, for example, the active layer 507 may include amorphous silicon, polycrystalline silicon and the like.

The first gate insulating layer 510 may be disposed on the buffer layer 505. The first gate insulating layer 510 may be disposed to cover the active layer 507. The first gate insulating layer 510 may include silicon, metal oxide and the like.

The gate electrode 513 may be disposed on the first gate insulating layer 510. The gate electrode 513 may include a metal, an alloy, metal nitride, conductive metal oxide, a transparent conductive material and the like. In an embodiment, for example, the gate electrode 513 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum (Al) alloy, aluminum nitride ($AlN_x$), a silver (Ag) alloy, tungsten (W), tungsten nitride ($WN_x$), a copper (Cu) alloy, a molybdenum (Mo) alloy, titanium nitride ($TiN_x$), tantalum nitride ($TaN_x$), strontium ruthenium oxide ($SrRu_xO_y$), zinc oxide ($ZnO_x$), indium-tin oxide ("ITO"), tin oxide ($SnO_x$), indium oxide ($InO_x$), gallium oxide ($GaO_x$), indium-zinc oxide ("IZO") and the like. These may be used alone or in combination with each other.

The first interlayer insulating layer 515 may be disposed on the first gate insulating layer 510 to cover the gate electrode 513. The first interlayer insulating layer 515 may include silicon, metal oxide and the like. In an embodiment, for example, the first interlayer insulating layer 515 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$) and the like. In embodiments, the first interlayer insulating layer 515 may have a flat top surface. In embodiments, the first interlayer insulating layer 515 may be provided or formed along a profile of the gate electrode 513 to have a uniform thickness.

Although not shown, at least one electrode pattern may be disposed between the first interlayer insulating layer 515 and the second interlayer insulating layer 520. In embodiments, the electrode pattern may overlap or be aligned with the gate electrode 513 along the thickness direction (e.g., vertical direction in FIG. 12) to operate as a capacitance electrode.

In embodiments, the electrode pattern may overlap the active layer 523. In this case, the electrode pattern may be disposed under the active layer 523 (e.g., closer to the substrate 500 than the active layer 523) to block light, or may serve as a lower gate electrode. Alternatively, the electrode pattern may be connected to a power source located outside the layers shown in FIG. 12. Accordingly, a voltage may be supplied from the power source to the electrode pattern.

The second interlayer insulating layer 520 may be disposed on the first interlayer insulating layer 515. In embodiments, the second interlayer insulating layer 520 may have a flat top surface. The second interlayer insulating layer 520 may include silicon, metal oxide and the like.

The lower active layer 523a may be disposed on the second interlayer insulating layer 520. The lower active layer 523a may include an oxide-based semiconductor material and an oxygen-gettering material. In an embodiment, for example, the lower active layer 523a may include at least one selected from hafnium (Hf), strontium (Sr), barium (Ba), magnesium (Mg), lanthanum (La), yttrium (Y), zirconium (Zr) and scandium (Sc) as the oxygen-gettering material. In an embodiment, for example, the lower active layer 523a may include the oxide-based semiconductor material doped with the oxygen-gettering material. In embodiments, the content of the oxygen-gettering material included in the lower active layer 523a may be approximately 0.5 atomic percent to approximately 5 atomic percent.

The upper active layer 523b may be disposed on the lower active layer 523a. The upper active layer 523b may make contact with the lower active layer 523a. The upper active layer 523b may include the oxide-based semiconductor material. In an embodiment, for example, the upper active layer 523b may include at least one selected from zinc oxide ($ZnO_x$), tin oxide ($SnO_x$), indium oxide ($InO_x$), indium-zinc oxide ("IZO"), indium-gallium oxide ("IGO"), zinc-tin oxide ($ZnSn_xO_y$) and indium-gallium-zinc oxide ("IGZO").

Since the lower active layer 523a includes the oxygen-gettering material, the content of oxygen included in the upper active layer 523b may be reduced. In a process of thermally treating the lower active layer 523a and the upper active layer 523b, the oxygen included in the upper active layer 523b may move to the lower active layer 523a. Thus, oxygen vacancies in the upper active layer 523b may be increased, so that electron mobility of the upper active layer 523b may be increased. Accordingly, electron mobility and electrical reliability of the fifth transistor TFT5 may be improved. The oxygen which is moved to the lower active layer 523a increases, the content of oxygen included in the lower active layer 523a. In addition, the oxygen vacancies in the upper active layer 523b may be greater than oxygen vacancies in the lower active layer 523a.

In embodiments, the upper active layer 523b may include the indium-gallium-zinc oxide ("IGZO"), and the lower active layer 523a may include a material in which the indium-gallium-zinc oxide ("IGZO") is doped with the hafnium (Hf). However, since the above configuration is provided for illustrative purposes, the upper active layer 523b may include at least one among the oxide-based semiconductor materials, and the lower active layer 523a may include the respective oxide-based semiconductor material doped with at least one of the oxygen-gettering materials.

In embodiments, a total thickness of the active layer 523 may be approximately 15 nm to approximately 60 nm. A thickness ratio of the upper active layer 523b to the lower active layer 523a may be approximately 1:4 to 4:1.

The second gate insulating layer 525 may be disposed on the second interlayer insulating layer 520. The second gate insulating layer 525 may be disposed to cover the active layer 523. In embodiments, the second gate insulating layer 525 may have a flat top surface. In embodiments, the second gate insulating layer 525 may be provided or formed along a profile of the active layer 523 with a uniform thickness. The second gate insulating layer 525 may include silicon, metal oxide and the like.

The gate electrode 527 may be disposed on the second gate insulating layer 525. The gate electrode 527 may include a metal, an alloy, metal nitride, conductive metal oxide, a transparent conductive material and the like.

The third interlayer insulating layer 530 may be disposed on the second gate insulating layer 525 to cover the gate electrode 527. The third interlayer insulating layer 530 may include silicon, metal oxide and the like. In embodiments, the third interlayer insulating layer 530 may have a flat top surface. In embodiments, the third interlayer insulating layer 530 may be provided or formed along a profile of the gate electrode 527 to have a uniform thickness.

The source electrodes 531 and 533 and the drain electrodes 532 and 534 may each be disposed on the third interlayer insulating layer 530. That is, the source electrodes 531 and 533 and the drain electrodes 532 and 534 are in a same layer as each other. The source electrode 531 may be connected to a source region of the active layer 523 through a contact hole. The source electrode 533 may be connected to a source region of the active layer 507 through a contact hole. The drain electrode 532 may be connected to a drain region of the active layer 523 through a contact hole. The drain electrode 534 may be connected to a drain region of the active layer 507 through a contact hole. The source electrodes 531 and 533 and the drain electrodes 532 and 534 may include or be formed of a conductive material such as molybdenum (Mo), copper (Cu), aluminum (Al) or titanium (Ti).

In embodiments, the display device includes the sixth transistor TFT6 including the silicon-based semiconductor material so that high electron mobility may be ensured, and simultaneously, the display device includes the fifth transistor TFT5 including the oxide-based semiconductor material so that a leakage of electrical current may be reduced.

Although the fifth transistor TFT5 and the sixth transistor TFT6 have been shown in FIG. 12 as having a top gate structure, the above configuration is provided for illustrative purposes, and embodiments are not limited thereto. In an embodiment, for example, the fifth transistor TFT5 and the sixth transistor TFT6 may have a bottom gate structure. However, where a transistor has a bottom gate structure, positions of the lower active layer 523a and the upper active layer 523b along a thickness direction may be reversed.

The via insulating layer 535 may be disposed on the third interlayer insulating layer 530 to cover the source electrodes 531 and 533 and the drain electrodes 532 and 534. In embodiments, the via insulating layer 535 may be subject to a planarization process to arrange the organic light emitting diode OLED. Accordingly, the via insulating layer 535 may have a flat top surface. The via insulating layer 535 may include silicon, metal oxide and the like. In addition, the via insulating layer 535 may include or be formed of an organic insulating material such as polyimide ("PI").

The lower electrode 541 may be disposed on the via insulating layer 535. The lower electrode 541 may be connected to the sixth transistor TFT6 through a contact hole provided at a region excluding a part of the via insulating layer 535. In embodiments, the lower electrode 541 may be connected to the drain electrode 534. The lower electrode 541 may include or be formed of a conductive material such as a metal, an alloy or transparent conductive oxide. In an embodiment, for example, the conductive material may include silver (Ag), indium-tin oxide ("ITO") and the like.

The pixel defining layer PDL may be disposed on the via insulating layer 535. The pixel defining layer PDL may cover an edge of the lower electrode 541, and may define a pixel opening that exposes a top surface of the lower electrode 541 to outside the pixel defining layer PDL. The pixel defining layer PDL may include or be formed of an organic insulating material such as polyimide ("PI").

The intermediate layer 542 may be disposed on the lower electrode 541. The intermediate layer 542 may be disposed on the lower electrode 541 exposed by the pixel opening to outside the pixel defining layer PDL. The intermediate layer 542 may include at least one of an organic light emitting material and a quantum dot.

The upper electrode 543 may be disposed on the intermediate layer 542. In embodiments, the upper electrode 543 may be disposed on the pixel defining layer PDL. The upper electrode 543 may include be formed of a conductive material such as a metal, an alloy or transparent conductive oxide. In embodiment, for example, the conductive material may include aluminum (Al), platinum (Pt), silver (Ag), magnesium (Mg), gold (Au), chromium (Cr), tungsten (W), titanium (Ti) and the like.

FIG. 13 is a cross-sectional view showing an embodiment of a transistor of FIG. 2. A seventh transistor TFT7 of FIG. 13 may be substantially the same as each of the first transistors TFT1 of FIG. 2 except for excluding the interlayer insulating layer 330 of FIG. 2. Therefore, descriptions of redundant components will be omitted.

Referring to FIGS. 2 and 13, in the seventh transistor TFT7, the source electrode 331 and the drain electrode 332 may make direct contact with the active layer 325. In other words, unlike the first transistors TFT1, the source electrode 331 and the drain electrode 332 may make contact with the active layer 325 without a contact hole since the interlayer insulating layer 330 is excluded from between the active layer 325 and each of the source electrode 331 and the drain electrode 332. The source electrode 331 and the drain electrode 332 also extend in a direction along the substrate 300 from the active layer 325 to make contact with the gate insulating layer 320. The gate insulating layer 320 and the via insulating layer 340 form an interface with each other. In embodiments, the active layer 325 may be a single layer or may include multiple layers along the thickness direction of the substrate 300.

Although embodiments of the invention have been described above, it will be understood by those of ordinary skill in the art that various changes and modifications can be made to the invention without departing from the idea and scope of the invention as disclosed in the appended claims.

The invention may be applied to a transistor and a display device including the same. Embodiments of the invention may be applied to a high-resolution smartphone, a mobile phone, a smart pad, a smart watch, a tablet personal computer ("PC"), a vehicle navigation system, a television, a computer monitor, a laptop computer and the like.

Although exemplary embodiments of the present invention have been described above, it will be understood by those of ordinary skill in the art that various changes and modifications can be made to the present invention without departing from the idea and scope of the present invention as disclosed in the appended claims.

What is claimed is:

1. A transistor comprising:
   a gate electrode;
   an active layer facing the gate electrode; and
   a source electrode and a drain electrode connected to the active layer,
   wherein the active layer includes:
      a lower active layer and an upper active layer which face each other and each include an oxide semiconductor material,
      the upper active layer closer to the source electrode and the drain electrode than the lower active layer and further including an oxygen-gettering material, the lower active layer excluding the oxygen-gettering material, and each of the lower active layer and the upper active layer having a thickness, wherein the thickness of the lower active layer is different from the thickness of the upper active layer.

2. The transistor of claim 1, wherein the oxide semiconductor material includes at least one selected from zinc oxide, tin oxide, indium oxide, indium-zinc oxide, indium-gallium oxide, zinc-tin oxide and indium-gallium-zinc oxide.

3. The transistor of claim 1, wherein the oxygen-gettering material includes at least one selected from hafnium, strontium, barium, magnesium, lanthanum, yttrium, zirconium and scandium.

4. The transistor of claim 1, wherein the active layer has a total thickness including the lower active layer and the upper active layer, and the total thickness of the active layer is approximately 15 nanometers to approximately 60 nanometers.

5. The transistor of claim 1, wherein the lower active layer and the upper active layer contact each other, each of the lower active layer and the upper active layer has oxygen vacancies, and the oxygen vacancies in the lower active layer are greater than the oxygen vacancies in the upper active layer.

6. The transistor of claim 1, wherein a content of the oxygen-gettering material in the upper active layer is approximately 0.5 atomic percent to approximately 5 atomic percent.

7. The transistor of claim 1, wherein a ratio of the thickness of the lower active layer to the thickness of the upper active layer is approximately 1:4 to approximately 4:1.

8. A transistor comprising:

an active layer;

a gate electrode facing the active layer; and a source electrode and a drain electrode connected to the active layer, wherein the active layer includes:

a lower active layer and an upper active layer which face each other and each include an oxide semiconductor material, the lower active layer further including an oxygen-gettering material, and the upper active layer closer to the source electrode and the drain electrode than the lower active layer and excluding the oxygen-gettering material.

9. The transistor of claim 8, wherein the oxide semiconductor material includes at least one selected from zinc oxide, tin oxide, indium oxide, indium-zinc oxide, indium-gallium oxide, zinc-tin oxide and indium-gallium-zinc oxide.

10. The transistor of claim 8, wherein the oxygen-gettering material includes at least one selected from hafnium, strontium, barium, magnesium, lanthanum, yttrium, zirconium and scandium.

11. The transistor of claim 8, wherein the active layer has a total thickness including the lower active layer and the upper active layer, and the total thickness of the active layer is approximately 15 nanometers to approximately 60 nanometers.

12. The transistor of claim 8, wherein the lower active layer and the upper active layer contact each other, each of the lower active layer and the upper active layer has oxygen vacancies, and the oxygen vacancies in the upper active layer are greater than the oxygen vacancies in the lower active layer.

13. The transistor of claim 8, wherein a content of the oxygen-gettering material in the lower active layer is approximately 0.5 atomic percent to approximately 5 atomic percent.

14. The transistor of claim 8, wherein each of the lower active layer and the upper active layer has a thickness, and a ratio of the thickness of the lower active layer to the thickness of the upper active layer is 1:4 to 4:1.

15. A display device comprising:

a substrate;

a first transistor on the substrate and including a first active layer; and a display element on the substrate and including in order from the first transistor, a lower electrode, an intermediate layer, and an upper electrode, wherein the first active layer includes:

a lower active layer and an upper active layer which face each other and each include an oxide semiconductor material, the lower active layer further including an oxygen-gettering material, and the upper active layer further from the substrate than the lower active layer and excluding the oxygen-gettering material.

16. The display device of claim 15, wherein the oxide semiconductor material includes at least one selected from zinc oxide, tin oxide, indium oxide, indium-zinc oxide, indium-gallium oxide, zinc-tin oxide and indium-gallium-zinc oxide.

17. The display device of claim 15, wherein the oxygen-gettering material includes one selected from hafnium, strontium, barium, magnesium, lanthanum, yttrium, zirconium and scandium.

18. The display device of claim 15, wherein the lower active layer and the upper active layer contact each other, each of the lower active layer and the upper active layer have oxygen vacancies, and the oxygen vacancies in the upper active layer are greater than the oxygen vacancies in the lower active layer.

19. The display device of claim 15, further comprising a second transistor on the substrate and including a second active layer, wherein the second active layer includes a single layer of the oxide semiconductor material.

20. The display device of claim 19, wherein each of the first transistor and the second transistor includes electron mobility, and the electron mobility of the first transistor including the first active layer is greater than the electron mobility of the second transistor including the second active layer.

21. The display device of claim 19, wherein the first active layer of the first transistor and the second active layer of the second transistor are in a same layer as each other.

22. The display device of claim 15, further comprising a second transistor on the substrate and including a second active layer, wherein the second active layer includes a silicon semiconductor material, and the second transistor is connected to the display element at the lower electrode.

23. The display device of claim 22, wherein the first active layer of the first transistor and the second active layer of the second transistor are in different layers from each other.

* * * * *